US012588417B2

(12) United States Patent
Suzuki et al.

(10) Patent No.: US 12,588,417 B2
(45) Date of Patent: Mar. 24, 2026

(54) PIEZOELECTRIC ELEMENT

(71) Applicants: DENSO CORPORATION, Kariya-city (JP); TOYOTA JIDOSHA KABUSHIKI KAISHA, Toyota (JP); MIRISE Technologies Corporation, Nisshin (JP); Nisshinbo Micro Devices Inc., Tokyo (JP)

(72) Inventors: Megumi Suzuki, Nisshin (JP); Tomoya Joke, Nisshin (JP); Hideo Yamada, Nisshin (JP); Shuji Katakami, Tokyo (JP); Takahide Usui, Tokyo (JP); Takashi Kakefuda, Tokyo (JP); Naoki Masumoto, Tokyo (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP); Nisshinbo Micro Devices Inc., Tokyo (JP)

( * ) Notice: Subject to any disclaimer, the term of this patent is extended or adjusted under 35 U.S.C. 154(b) by 888 days.

(21) Appl. No.: 17/891,313

(22) Filed: Aug. 19, 2022

(65) Prior Publication Data

US 2023/0060555 A1 Mar. 2, 2023

(30) Foreign Application Priority Data

Aug. 31, 2021 (JP) ................................. 2021-141930

(51) Int. Cl.
H01L 41/09 (2006.01)
H10N 30/00 (2023.01)
(Continued)

(52) U.S. Cl.
CPC ....... H10N 30/2045 (2023.02); H10N 30/708 (2024.05); H10N 30/85 (2023.02); H10N 30/871 (2023.02)

(58) Field of Classification Search
CPC ..... H10N 30/871; H10N 30/85; H10N 30/708
See application file for complete search history.

(56) References Cited

U.S. PATENT DOCUMENTS

2009/0244203 A1* 10/2009 Mita ........................ B41J 2/161
29/25.35
2012/0250909 A1* 10/2012 Grosh .................... H10N 30/05
381/174
(Continued)

FOREIGN PATENT DOCUMENTS

JP 2009-267616 A 11/2009
JP 2013-225546 A 10/2013
(Continued)

*Primary Examiner* — Bryan P Gordon
(74) *Attorney, Agent, or Firm* — Posz Law Group, PLC

(57) ABSTRACT

A piezoelectric element includes a support member, a vibrator, a through electrode and a seed layer. The vibrator is disposed on an insulation film of the support member, and includes a piezoelectric film and an electrode coating film electrically connected to the piezoelectric film. The vibrator has a support region and a vibration region. The through electrode is electrically connected to the electrode coating film at the support region, and is disposed in a stacking direction of the support member and the vibrator. Between the piezoelectric film and the insulation film, the seed layer is disposed at a portion of the electrode coating film facing another portion of the electrode coating film connected to the through electrode in the stacking direction. The seed layer is made of material having a lattice constant closer to the piezoelectric film or material easier to cause the piezoelectric film to be self-aligned.

10 Claims, 8 Drawing Sheets

(51) Int. Cl.
   *H10N 30/20*        (2023.01)
   *H10N 30/85*        (2023.01)
   *H10N 30/87*        (2023.01)

(56)                References Cited

U.S. PATENT DOCUMENTS

| | | | |
|---|---|---|---|
| 2015/0271606 A1 | 9/2015 | Grosh et al. | |
| 2018/0069168 A1* | 3/2018 | Ikeuchi | H10N 30/05 |
| 2019/0281393 A1* | 9/2019 | Grosh | H04R 7/06 |
| 2021/0057634 A1* | 2/2021 | Kishimoto | H10N 30/874 |

FOREIGN PATENT DOCUMENTS

| | | |
|---|---|---|
| JP | 2016-054200 A | 4/2016 |
| JP | 2018-137297 A | 8/2018 |
| JP | 2020-178109 A | 10/2020 |

* cited by examiner

PIEZOELECTRIC ELEMENT

CROSS REFERENCE TO RELATED APPLICATION

This application is based on Japanese Patent Application No. 2021-141930 filed on Aug. 31, 2021, the disclosure of which is incorporated herein by reference.

TECHNICAL FIELD

The present disclosure relates to a piezoelectric element.

BACKGROUND

A piezoelectric element may have a vibrator. For example, in the piezoelectric element, the vibrator may have a piezoelectric film and an electrode film electrically connected to the piezoelectric film.

SUMMARY

The present disclosure describes a piezoelectric element including a support member, a vibrator, a through electrode, and a seed layer.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
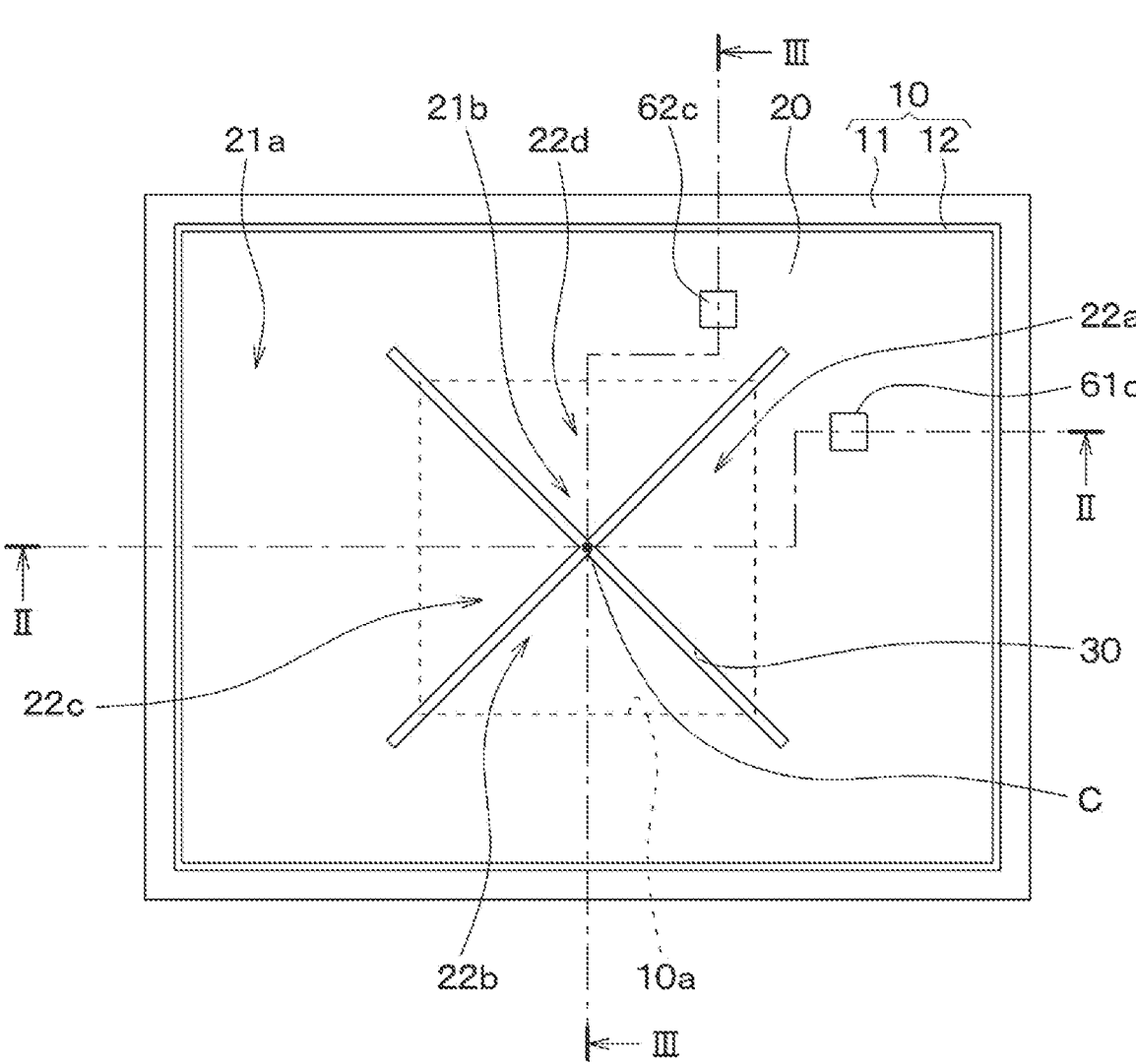
FIG. 1 is a plan view of a piezoelectric element according to a first embodiment.

In a piezoelectric element, a vibrator having a piezoelectric film and an electrode film electrically connected to the piezoelectric film may be disposed on a support member.

The support member may have an oxide film stacked on a support substrate, and the vibrator may be disposed on the oxide film. A recess portion may be formed at the support member. The vibrator may have a support region supported on the support member and a float region floated from the support member. The electrode film may be disposed in the piezoelectric film and on the piezoelectric film, and may extend from the float region to the support region. The electrode film may have an electrode coating film electrically connected to a through electrode in a stacking direction of the support member and the vibrator at the support region. The through electrode may be disposed at a hole that exposes the electrode coating film along in stacking direction of the support member and the vibrator.

In the piezoelectric element, since the vibrator is disposed on the oxide film, the piezoelectric film may have a decline in its crystallinity, and the electrode coating film disposed on the piezoelectric film may also have a decline in its crystallinity. When the through electrode is connected to the electrode coating film, a hole is formed for exposing the electrode coating film to arrange the through electrode at the hole. However, when the electrode coating film has a decline in its crystallinity, the electrode coating film may be excessively etched when the hole is formed, and the junction between the through electrode and the electrode coating film may be weaker.

According to an aspect of the present disclosure, a piezoelectric element includes a support member, a vibrator, a through electrode and a seed layer. The support member includes a support substrate and an insulation film disposed on the support substrate. The vibrator is disposed on the insulation film included in the support member. The vibrator includes a piezoelectric film and an electrode film. The first electrode film has an electrode coating film electrically connected to the piezoelectric film and disposed on the piezoelectric film or inside the piezoelectric film. The vibrator has: a support region that is supported by the support member; and a vibration region that is connected to the support region and floated from the support member. The piezoelectric film and the electrode film are included in the vibrator. The electrode film has an electrode coating film electrically connected to the piezoelectric film and disposed on the piezoelectric film or inside the piezoelectric film. The through electrode is in a stacking direction of the support member and the vibrator, and is connected to the electrode coating film at the support region. The seed layer is disposed at a first portion of the electrode coating film facing a second portion of the electrode coating film connected to the through electrode between the piezoelectric film and the insulation film. The seed layer is made of material having a lattice constant closer to the piezoelectric film than the insulation film or material easier to cause the piezoelectric film to be self-aligned than the insulation film.

According to the above structure, the seed layer is disposed at the first portion of the electrode coating film facing the second portion connected to the through electrode. Therefore, it is possible to prevent the piezoelectric film disposed on the seed layer from losing its crystallinity, and it is possible to prevent the second portion of the electrode coating film connected to the through electrode from losing its crystallinity. As a result, it is possible to suppress a decline in the reliability of the connection between the electrode coating film and the through electrode.

The following describes several embodiments with reference to the drawings. In the following embodiments, the same or equivalent parts are denoted by the same reference numerals as each other, and explanations will be provided to the same reference numerals.

First Embodiment

Figure 2:
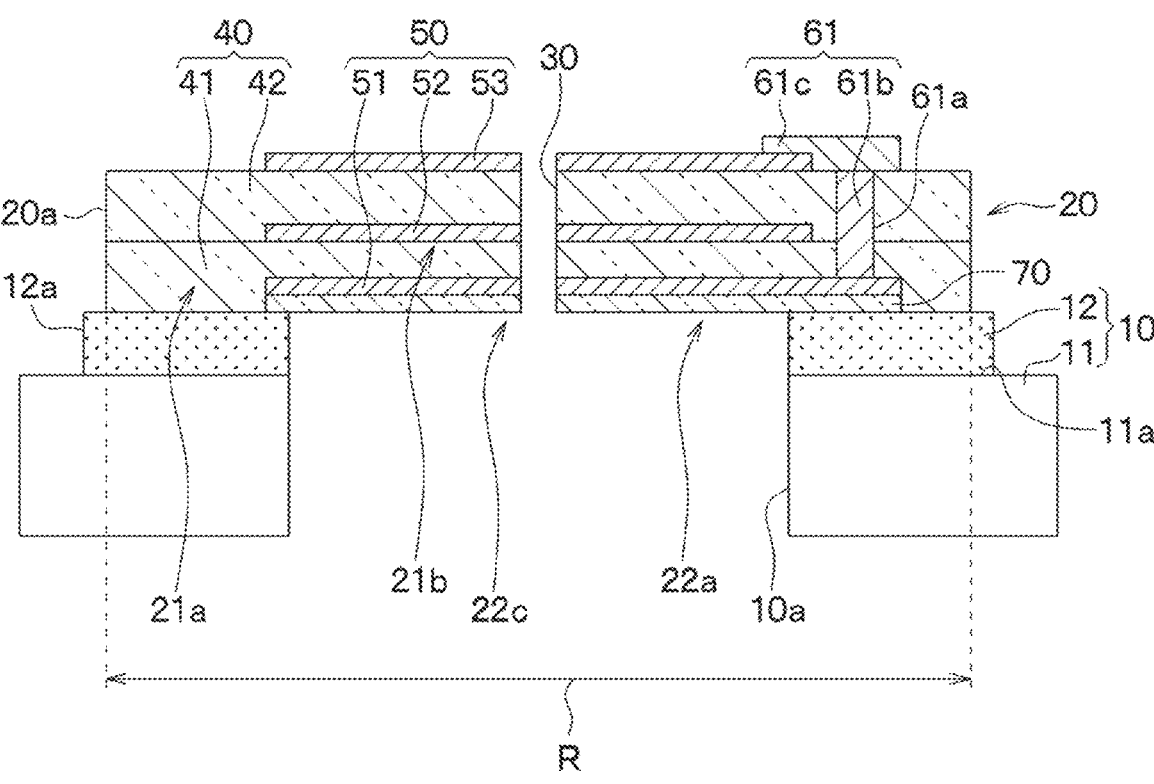
FIG. 2 is a cross-sectional view of the piezoelectric element taken along a line II-II shown in FIG. 1.
Figure 3:
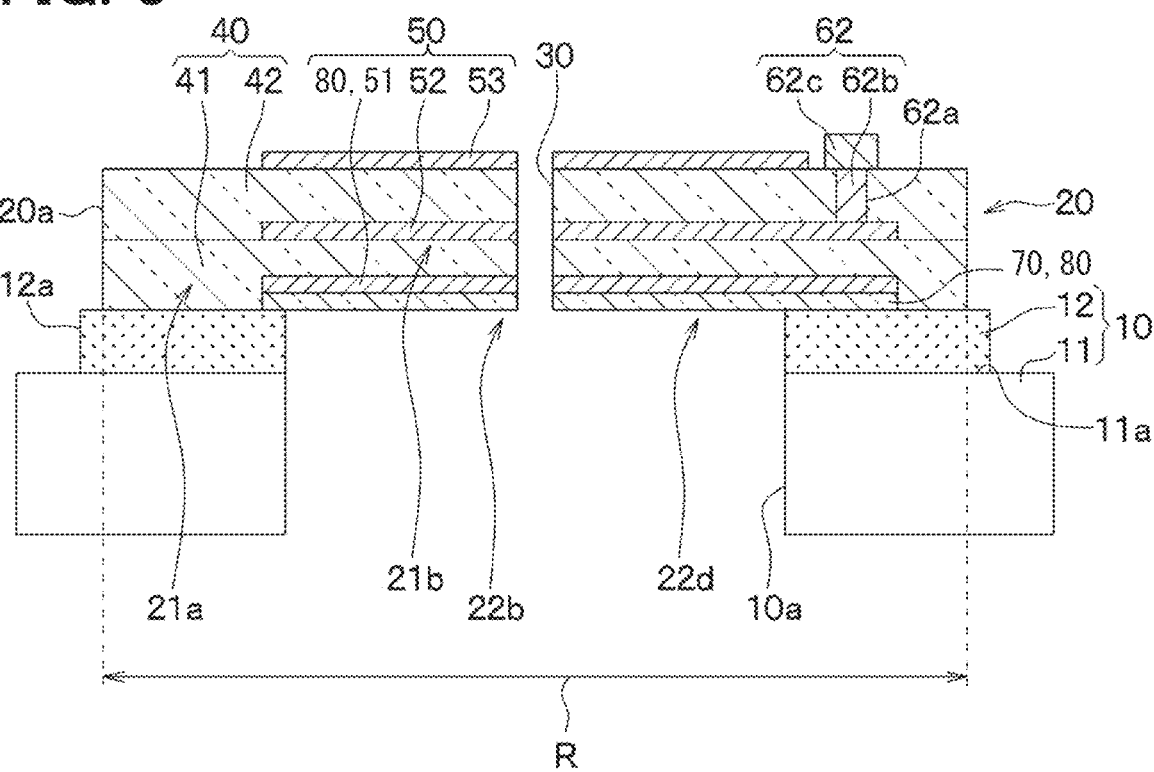
FIG. 3 is a cross-sectional view of the piezoelectric element taken along a line III-III shown in FIG. 1.

The following describes a piezoelectric element according to a first embodiment with reference to FIGS. 1 to 3. The piezoelectric element according to the present embodiment may be applied to a piezoelectric microphone adapted to, for example, a smartphone or an artificial intelligence (AI) speaker. In addition, the piezoelectric element according to the present embodiment may be adopted for, for example, an ultrasonic sensor.

As illustrated in FIGS. 1 to 3, the piezoelectric element includes a support member 10 and a vibrator 20 disposed on the support member 10, and has a flat rectangular shape. The support member 10 has a support substrate 11 with a first surface 11*a* and an insulation film 12 formed on the first surface 11*a* of the support substrate 11. The support substrate 11 is made of, for example, a silicon substrate, and the insulation film 12 is made of an oxide film or the like.

In the support member 10, a recess portion 10*a* is formed for causing an inner edge side of the vibrator 20 to float. The recess portion 10*a* corresponds to a recess. Therefore, the vibrator 20 has a structure with a support region 21*a* disposed on the support member 10 and a float region 21*b* connected to the support region 21*a* and floating above the recess portion 10*a*. The recess portion 10*a* according to the present embodiment has a flat rectangular shape at the opening end at a side closer to the vibrator 20. Therefore, the entire float region 21*b* has a flat rectangular shape.

An opening 20*a* for exposing an outer edge section of the insulation film 12 is formed at an outer edge section of the vibrator 20 according to the present embodiment. The insulation film 12 includes an opening 12*a* that exposes an outer edge section of the support substrate 11 at the outer edge section of the insulation film 12. Therefore, the outer edge section of the support substrate 11 is exposed from the insulation film 12 and the vibrator 20. The opening 12*a* formed in the insulation film 12 and the opening 20*a* formed in the vibrator 20 facilitate the dicing step when manufacturing the piezoelectric element, and may not necessarily be formed. In the following, a region of the piezoelectric element where the vibrator 20 is disposed is defined as an element region R. Each of the openings 20*a*, 12*a* may also be referred to as an aperture.

The float region 21*b* includes slits 30 that respectively penetrate the float region 21*b* in a thickness direction. The slits 30 according to the present embodiment are formed to divide the float region 21*b* into four parts. In the present embodiment, two slits 30 are formed so as to pass through a center C of the float region 21*b* and extend toward the opposite corners of the float region 21*b*. In other words, the slits 30 respectively extend to the center C from the corners of the float region 21*b* having a flat rectangular shape, and intersect with each other at the center C. As a result, the float region 21*b* is divided into four vibration regions as a first vibration region 22*a*, a second vibration region 22*b*, a third vibration region 22*c* and a fourth vibration region 22*d*, each of which has a substantially flat triangular shape. In the following description, the slits 30 may be described in a singular form as the slit 30. Although not particularly limited, in the present embodiment, the distance between adjacent two of the first vibration region 22*a*, the second vibration region 22*b*, the third vibration region 22*c* and the fourth vibration region 22*d* (that is, the width of the slit 30) is about 1 micrometer (μm). Although the slit 30 according to the present embodiment extends to the support region 21*a*, the slit 30 may terminate in the float region 21*b*. In the following, the first vibration region 22*a*, the second vibration region 22*b*, the third vibration region 22*c* and the fourth vibration region 22*d* may be simply described as vibration regions 22*a* to 22*d* in some occasions.

Each of the vibration regions 22*a* to 22*d* has a first end portion at a side closer to the support region 21*a* and a second end portion at a side opposite to the support region 21*a*. The first end portion is made as a fixed end, and the second end portion is made as a cantilever being a free end or an opened end.

The vibrator 20 has a piezoelectric film 40 and an electrode film 50 connected to the piezoelectric film 40. Specifically, the piezoelectric film 40 has a lower piezoelectric film 41 and an upper piezoelectric film 42 stacked on the lower piezoelectric film 41. The lower piezoelectric film 41 and the upper piezoelectric film 42 are made of lead-free piezoelectric ceramics such as scandium aluminum nitride (ScAlN) and aluminum nitride (AlN). The lower piezoelectric film 41 and the upper piezoelectric film 42 may also adopt, for example, lead zirconate titanate (PZT).

The electrode film 50 is formed at each of the vibration regions 22*a* to 22*d* to connect the piezoelectric film 40, and is made of molybdenum (Mo). Other than molybdenum, the electrode film 50 may made of metallic material having a main component being one of, for example, titanium (Ti), platinum (Pt), aluminum (Al), and ruthenium (Ru). The material included in the electrode film 50 has a lattice constant closer to the piezoelectric film 40 than the insulation film 12.

In the present embodiment, the electrode film 50 includes a lower electrode film 51 formed below the lower piezoelectric film 41, an intermediate electrode film 52 formed between the lower piezoelectric film 41 and the upper piezoelectric film 42, and an upper electrode film 53 formed above the upper piezoelectric film 42. The lower electrode film 51 and the intermediate electrode film 52 are disposed to face each other with the lower piezoelectric film 41 is interposed between the lower electrode film 51 and the intermediate electrode film 52. The intermediate electrode film 52 and the upper electrode film 53 are disposed to face each other with the upper piezoelectric film 42 is interposed between the intermediate electrode film 52 and the upper electrode film 53.

The piezoelectric element in the present embodiment outputs an electrical charge varied with the vibration of each of the vibration regions 22*a* to 22*d* as a detected signal. The piezoelectric element in the present embodiment outputs a change in the electrical charge at the vibration regions 22*a* to 22*d*. Specifically, the electrode films 50 respectively at the vibration regions 22*a* to 22*d* are electrically connected in series through a wiring portion (not shown). More specifically, each of the vibration regions 22*a* to 22*d* has a bimorph structure, and each lower electrode film 51, each intermediate electrode film 52, and each upper electrode film 53 formed in each of the vibration regions 22*a* to 22*d* are connected in parallel to each other, and the vibration regions 22*a* to 22*d* are connected in series.

A first electrode portion 61 and a second electrode portion 62 are formed at the piezoelectric element to connect an end portion of a series circuit in which the electrode films 50 respectively at the vibration regions 22*a* to 22*d* are connected in series. The first electrode portion 61 includes a first through electrode 61*b* and a first pad portion 61*c*, and is formed at the support region 21*a* to connect the lower electrode film 51 and the upper electrode film 53 formed at the first vibration region 22a. The second electrode portion 62 includes a second through electrode 62b and a second pad portion 62c, and is formed at the support region 21a to connect the intermediate electrode film 52 formed at the fourth vibration region 22d. The first pad portion 61c corresponds to a first pad, and the second pad portion 62c corresponds to a second pad.

As illustrated in FIG. 2, the lower electrode film 51 and the upper electrode film 53 formed at the first vibration region 22a extend to the support region 21a. A first hole 61a is formed to penetrate the upper piezoelectric film 42 and the lower piezoelectric film 41 to expose the lower electrode film 51. A first through electrode 61b is disposed at the first hole 61a to electrically connect the lower electrode film 51. The first pad portion 61c is disposed above the upper piezoelectric film 42 to electrically connect the first through electrode 61b and the upper electrode film 53.

As illustrated in FIG. 3, the intermediate electrode film 52 formed at the fourth vibration region 22d extends to the support region 21a. A second hole 62a is formed to penetrate the upper piezoelectric film 42 to expose the intermediate electrode film 52. The second through electrode 62b is disposed at the second hole 62a to electrically connect the intermediate electrode film 52. The second pad portion 62c is disposed above the upper piezoelectric film 42 to electrically connect the second through electrode 62b. In the present embodiment, the intermediate electrode film 52 corresponds to an electrode coating film, and the lower electrode film 51 corresponds to a ground electrode film or a base electrode film.

The vibrator 20 according to the present embodiment has a buffer layer 70 at which the lower piezoelectric film 41 and the lower electrode film 51 are disposed at a side closer to the support member 10. The buffer layer 70 is made of material having a lattice constant closer to the lower electrode film 51 than the insulation film 12. In other words, the buffer layer 70 is made of material easily matching the lattice of the lower electrode film 51 as compared with the insulation film 12. Such a buffer layer 70 is made of, for example, aluminum nitride (AlN).

The buffer layer 70 according to the present embodiment is formed at an entire portion where the float region 21b is formed. The buffer layer 70 is formed to face a portion of the intermediate electrode film 52 connected to the second through electrode 62b in a stacking direction of the support member 10 and the vibrator 20 (hereinafter simply referred to as a stacking direction). The lower electrode film 51 is formed at the entire region above the buffer layer 70, and is formed to include a portion of the intermediate electrode film 52 facing the portion connected to the second through electrode 62b. The buffer layer 70 and the lower electrode film 51 are disposed at a portion of the intermediate elec- trode film 52 connected to the second through electrode 62b, between the lower piezoelectric film 41 and the support member 10 (in other words, the insulation film 12).

Between the lower piezoelectric film 41 and the support member 10 (in other words, the insulation film 12), a layer disposed at a portion of the intermediate electrode film 52 facing the portion connected to the second through electrode 62b is referred to as a seed layer 80. The seed layer 80 according to the present embodiment includes the lower electrode film 51 and the buffer layer 70. The seed layer 80 according to the present embodiment is formed such that the seed layer 80 has a wider area than the second through electrode 62b (in other words, the second hole 62a) and the second through electrode 62b is located inside the seed layer 80 in the stacking direction.

In the present embodiment, the buffer layer 70 and the lower electrode film 51 are not formed to the outer edge end portion of the element region R. Therefore, the outer edge portion of the lower piezoelectric film 41 is disposed above the insulation film 12.

The above describes the structure of the piezoelectric element according to the present embodiment. In such a piezoelectric element, when pressure such as sound pressure is applied to each of the vibration regions 22a to 22d, each of the vibration regions 22a to 22d vibrates. In this case, for example, when the end portion side (that is, the free end side) of each of the vibration regions 22a to 22d is displaced upward, tensile stress is generated in the lower piezoelectric film 41 and compression stress is generated in the upper piezoelectric film 42. Therefore, the pressure such as the sound pressure is detected by extracting the electric charge from the first electrode portion 61 and the second electrode portion 62.

The following describes a method of manufacturing the piezoelectric element with reference to FIGS. 4A to 4G. Although the present embodiment describes that the piezo- electric element is manufactured by adopting the support member 10 with a wafer shape, the piezoelectric element may be manufactured by adopting the support member 10 which is preliminarily cut into chip units.

Figure 4A:
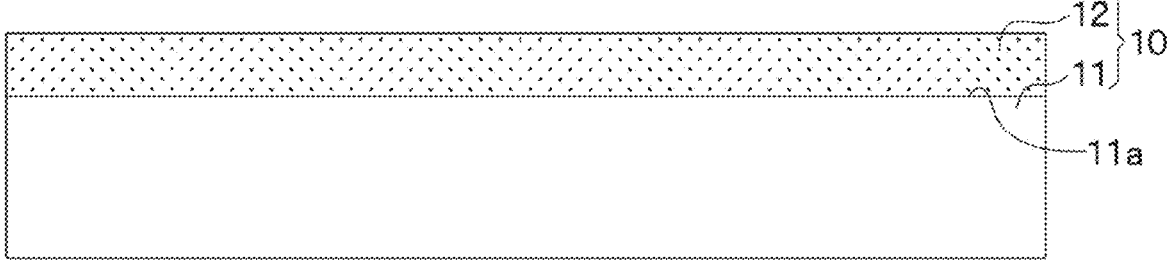
FIG. 4A is a cross-sectional view showing a manufacturing process of a piezoelectric element.

As illustrated in FIG. 4A, the support member 10 in which the insulation film 12 is disposed on the support substrate 11 is prepared. The support member 10 illustrated in FIG. 4A is formed to have a wafer shape such that multiple element constituent regions are integrated through a dicing line.

Figure 4B:
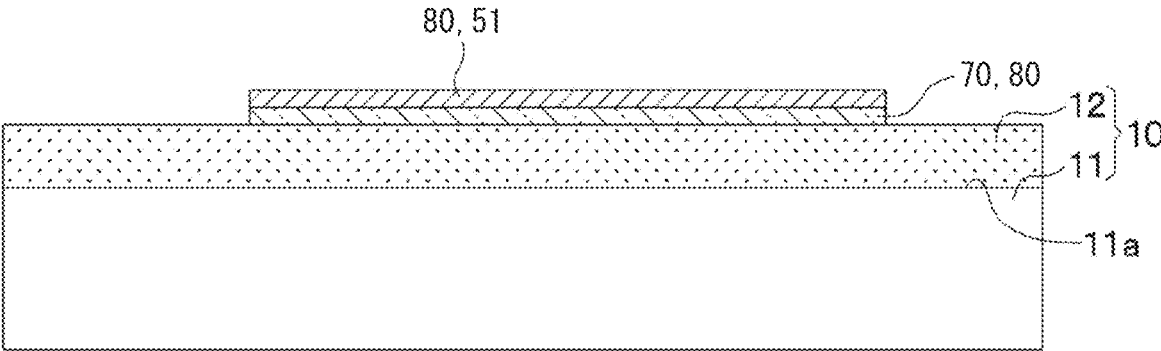
FIG. 4B is a cross-sectional view showing a manufacturing process of the piezoelectric element following FIG. 4A.

As illustrated in FIG. 4B, the buffer layer 70 and the lower electrode film 51 are sequentially formed on the support member 10, and are patterned into a predetermined shape by adopting a mask (not shown). In the present embodiment, the buffer layer 70 and the lower electrode film 51 are patterned to be disposed at the portion where the float region 21b is formed. The buffer layer 70 and the lower electrode film 51 are patterned to include a portion connected to the first through electrode 61b and a portion facing the second through electrode 62b in the stacking direction (in other words, a portion included in the seed layer 80).

The buffer layer 70 and the lower electrode film 51 are formed by, for example, a general sputtering method or a Chemical Vapor Deposition (CVD) method. The lower piezoelectric film 41, the intermediate electrode film 52, the upper piezoelectric film 42 and the upper electrode film 53 are also formed by, for example, a general sputtering method or the CVD method.

Figure 4C:
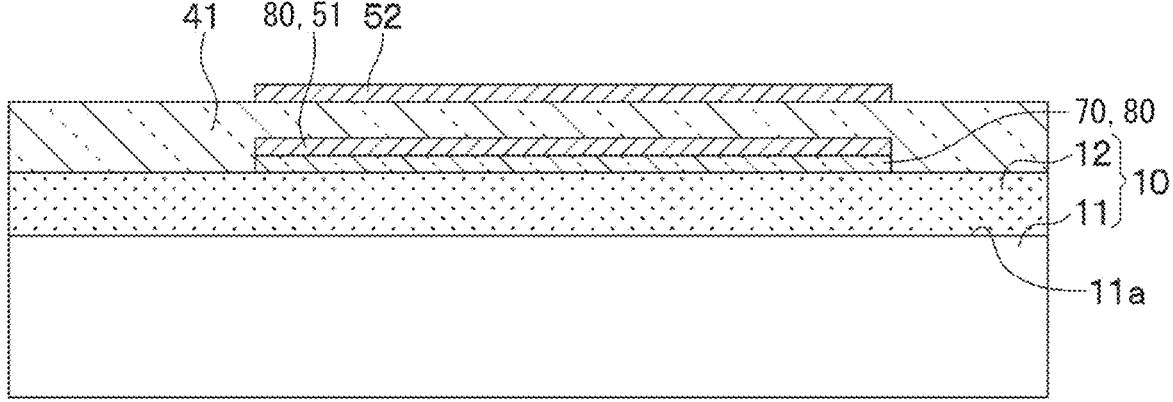
FIG. 4C is a cross-sectional view showing a manufacturing process of the piezoelectric element following FIG. 4B.

As illustrated in FIG. 4C, the lower piezoelectric film 41 and the intermediate electrode film 52 are formed. At this time, the lower electrode film 51 is made of molybdenum. Therefore, as compared with a case in which the lower piezoelectric film 41 is formed on the insulation film 12 as the base film, the difference between the lattice constant of the lower piezoelectric film 41 and the lattice constant of the lower electrode film 51 declines in a case where the lower piezoelectric film 41 is formed on the lower electrode film 51 as the base film. Therefore, in a portion on the lower electrode film 51, the lower piezoelectric film 41 and the lower electrode film 51 are easily lattice-matched, so that the crystallinity of the lower piezoelectric film 41 is less likely to have a decline. The crystallinity of a portion of the lower piezoelectric film 41 located on the seed layer 80 is also less likely to have a decline. As a result, the crystallinity of a portion of the intermediate electrode film 52 facing the lower electrode film 51 with the lower piezoelectric film 41 interposed between the intermediate electrode film 52 and the lower electrode film 51 is less likely to have a decline. In other words, the crystallinity of the portion of the intermediate electrode film 52 facing the seed layer 80 is less likely to have a decline.

Since the crystallinity of the portion of the lower piezoelectric film 41 and the crystallinity of the portion of the intermediate electrode film 52 formed on the lower electrode film 51 as the base film are less likely to have a decline, the entire float region 21*b* is less likely to have a decline.

Figure 4D:
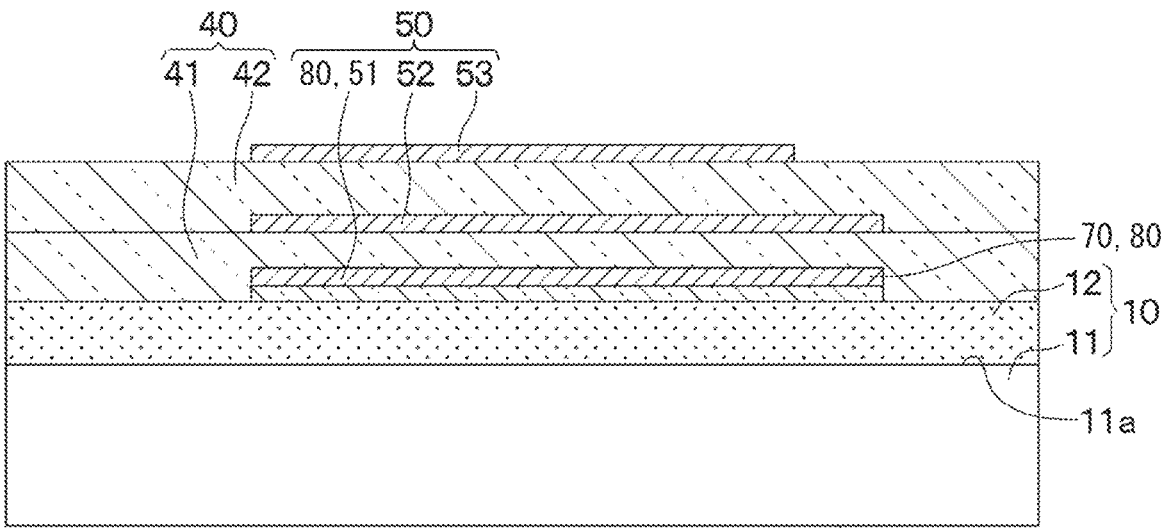
FIG. 4D is a cross-sectional view showing a manufacturing process of the piezoelectric element following FIG. 4C.

As illustrated in FIG. 4D, the upper piezoelectric film 42 is formed to make the piezoelectric film 40. The electrode film 50 is formed by forming the upper electrode film 53 and patterning the upper electrode film 53 in a predetermined shape by using a mask (not shown).

Figure 4E:
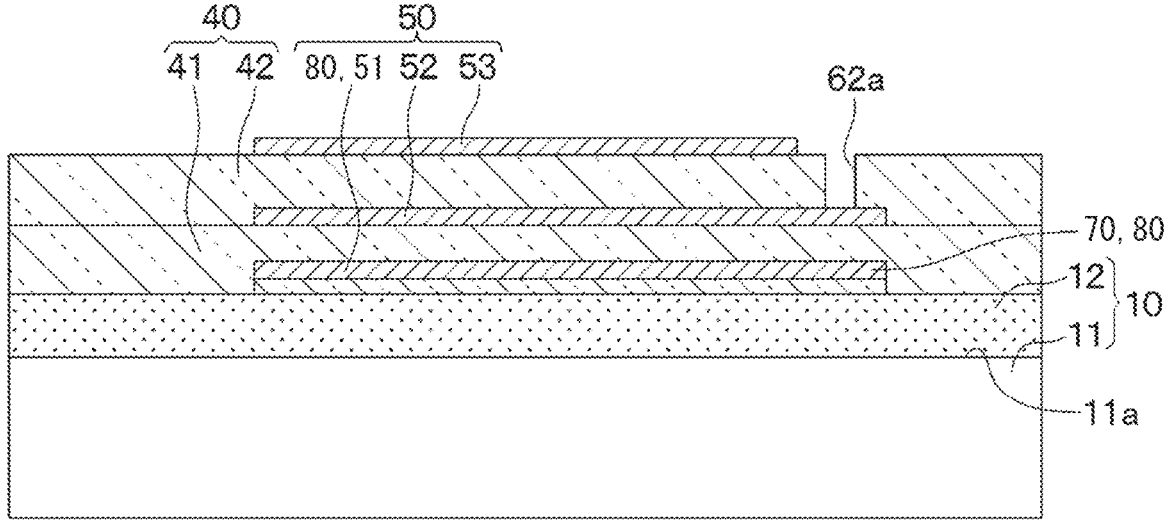
FIG. 4E is a cross-sectional view showing a manufacturing process of the piezoelectric element following FIG. 4D.

As illustrated in FIG. 4E, the second hole 62*a* for exposing the intermediate electrode film 52 is formed. At this time, the intermediate electrode film 52 is prevented from losing its crystallinity at the portion facing the seed layer 80. The intermediate electrode film 52 is prevented from losing its crystallinity at the portion exposed from the second hole 62*a*. In other words, the intermediate electrode film 52 is prevented from losing its crystallinity at the portion connected to the second through electrode 62*b*. When the second hole 62*a* is formed, it is possible to prevent the intermediate electrode film 52 from being excessively etched. Since it is possible to prevent the intermediate electrode film 52 from being excessively etched, there is no need to perform visual inspection several times when the second hole 62*a* is formed. Therefore, it is possible to shorten the manufacturing process. Although not particularly shown, in this process, the first hole 61*a* for exposing the lower electrode film 51 is also formed at another cross section different from FIG. 4E.

Figure 4F:
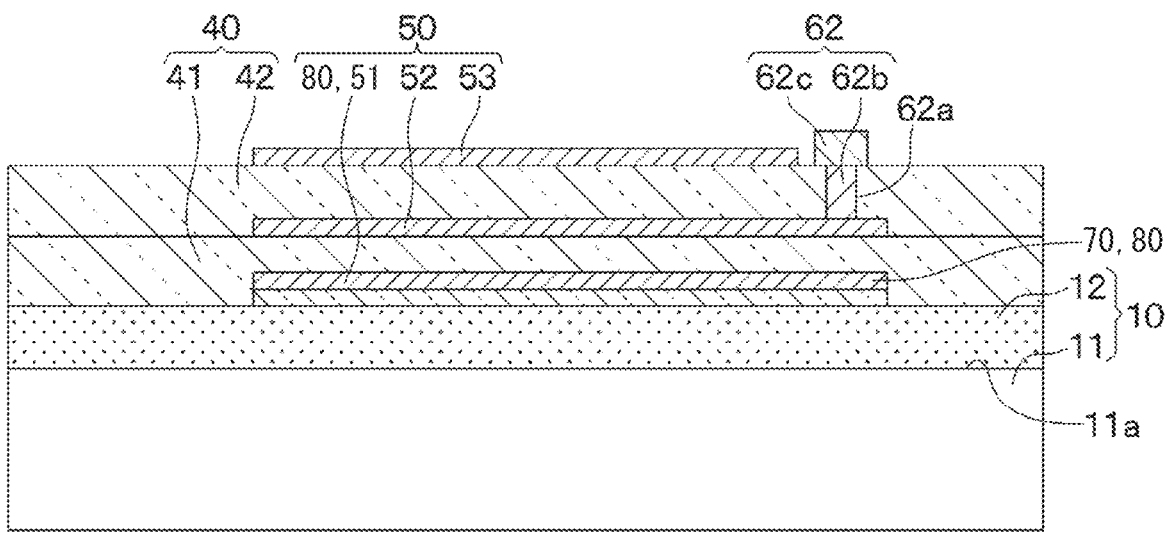
FIG. 4F is a cross-sectional view showing a manufacturing process of the piezoelectric element following FIG. 4E.

As illustrated in FIG. 4F, the second through electrode 62*b* is formed by forming a metallic film to embed the second hole 62*a*. The second pad portion 62*c* is formed to pattern the metallic film formed on the upper piezoelectric film 42. In a cross section different from that of FIG. 4F, a metallic film is formed so as to embed the first hole 61*a* to form the first through electrode 61*b*, and the first pad portion 61*c* is formed by patterning the metallic film formed on the upper piezoelectric film 42. As a result, the first electrode portion 61 and the second electrode portion 62 are formed.

Figure 4G:
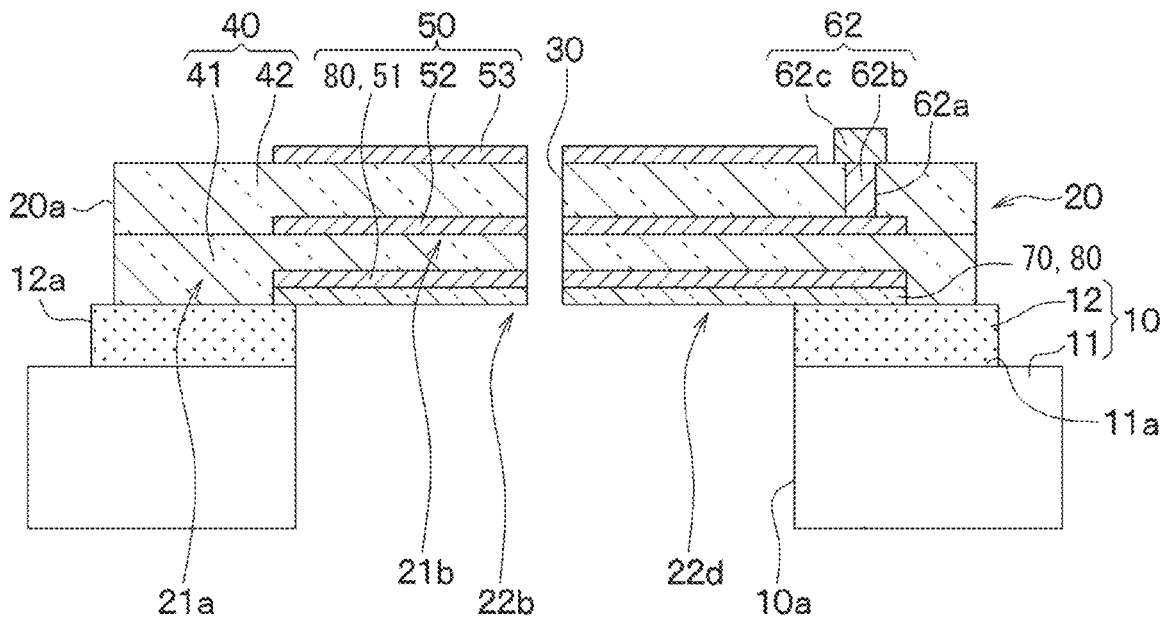
FIG. 4G is a cross-sectional view showing a manufacturing process of the piezoelectric element following FIG. 4F.

As illustrated in FIG. 4G, the slit 30 and the recess portion 10*a* are formed by appropriately arranging a mask (not shown) and performing etching. In the present embodiment, in order to facilitate a dicing process, the piezoelectric film 40 located at the dicing line is removed to form the opening 20*a*, and the insulation film 12 is removed to form the opening 12*a*. Then, it is divided into chip units along the dicing line. As a result, the above-mentioned piezoelectric element in which the vibrator 20 is disposed on the support member 10 is manufactured.

Although the present embodiment describes that the piezoelectric element is manufactured by adopting the support member 10 with a wafer shape, the piezoelectric element may be manufactured by adopting the support substrate 11 which is preliminarily cut into chip units.

According to the present embodiment, between the lower piezoelectric film 41 and the insulation film 12, the seed layer 80 is disposed at a portion of the intermediate electrode film 52 connected to the second through electrode 62*b*. Therefore, it is possible to prevent the lower piezoelectric film 41 disposed on the seed layer 80 from losing its crystallinity, and it is possible to prevent the portion of the intermediate electrode film 52 connected to the second through electrode 62*b* from losing its crystallinity. As a result, it is possible to suppress a decline in reliability of the connection between the intermediate electrode film 52 and the second through electrode 62*b*.

Since it is possible to prevent the portion of the intermediate electrode film 52 connected to the second through electrode 62*b* from losing its crystallinity, it is possible to prevent the intermediate electrode film 52 from being excessively etched when the second hole 62*a* for exposing the intermediate electrode film 52 is formed. As a result, it is possible to suppress a decline in reliability of the connection between the intermediate electrode film 52 and the second through electrode 62*b*.

Since it is possible to prevent the intermediate electrode film 52 from being excessively etched, there is no need to inspect the depth of the second hole 62*a* several times and the manufacturing process can be simplified, when the second hole 62*a* for exposing the intermediate electrode film 52 is formed.

Since it is possible to prevent the intermediate electrode film 52 from being excessively etched, the unevenness over multiple locations where the second holes 62*a* are respectively formed can be reduced, when the piezoelectric element is manufactured by using the support member 10 with the wafer shape as in the present embodiment. Therefore, it is possible to prevent the situation in which the second hole 62*a* is not properly formed being occurred, and it is possible to suppress a decline in the yield.

In the present embodiment, the seed layer 80 has an area larger than the second through electrode 62*b* in the stacking direction. Therefore, even though misalignment of the second through electrode 62*b*, in other words, the second hole 62*a* occurs, it is possible to prevent the situation in which the seed layer 80 is not disposed at the portion of the intermediate electrode film 52 facing the portion connected to the second through electrode 62*b*.

In the present embodiment, the seed layer 80 includes the buffer layer 70 and the lower electrode film 51. Therefore, as compared with a case where the seed layer 80 is made of material different from the buffer layer 70 and the lower electrode film 51, it is possible to shorten the manufacturing process.

Second Embodiment

The following describes a second embodiment. In the present embodiment, the shape of each of the buffer layer 70 and the lower electrode film 51 is changed from that of the first embodiment. The other configurations are the same as those of the first embodiment, and therefore a description of the same configurations will be omitted below.

Figure 5:
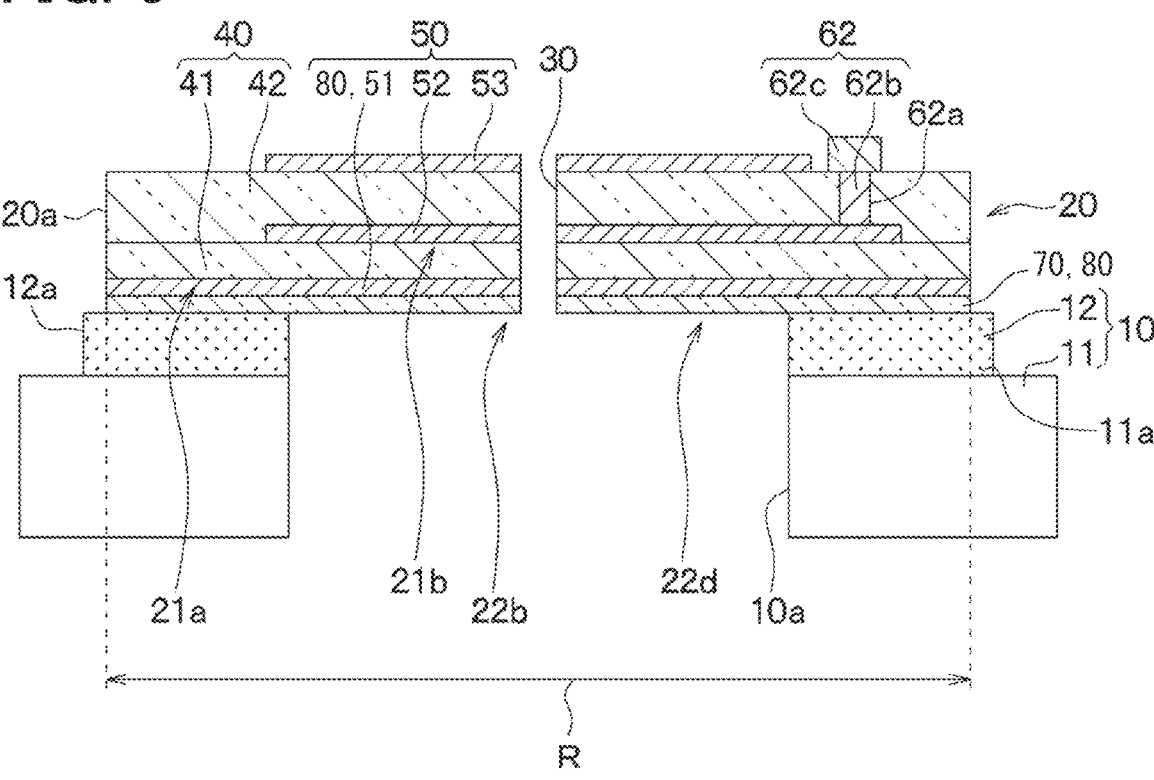
FIG. 5 is a cross-sectional view of a piezoelectric element according to a second embodiment.

In the piezoelectric element according to the present embodiment, as illustrated in FIG. 5, the buffer layer 70 and the lower electrode film 51 extend to the outer edge end portion of the element region R. In other words, the buffer layer 70 and the lower electrode film 51 are formed over the entire support region 21*a* and the entire float region 21*b*. The entire region of the lower piezoelectric film 41 is formed on the lower electrode film 51.

According to the present embodiment, between the lower piezoelectric film 41 and the insulation film 12, the seed layer 80 is disposed at a portion of the intermediate electrode film 52 connected to the second through electrode 62*b*. Therefore, it is possible to prevent the portion of the intermediate electrode film 52 connected to the second through electrode 62*b* from losing its crystallinity, and it is possible to attain the advantageous effect identical to the one in the first embodiment.

According to the present embodiment, the buffer layer 70 and the lower electrode film 51 are formed to the outer edge end portion of the element region R. The entire region of the lower piezoelectric film 41 is formed on the lower electrode film 51. Therefore, it is possible to prevent the entire region of the lower piezoelectric film 41 and the intermediate electrode film 52 from losing its crystallinity, and it is possible to enhance the reliability.

Third Embodiment

The following describes a third embodiment. In the present embodiment, the shape of each of the buffer layer 70 and the lower electrode film 51 is changed from that of the second embodiment. Descriptions of the same configurations and processes as those of the second embodiment will not be repeated hereinafter.

Figure 6:
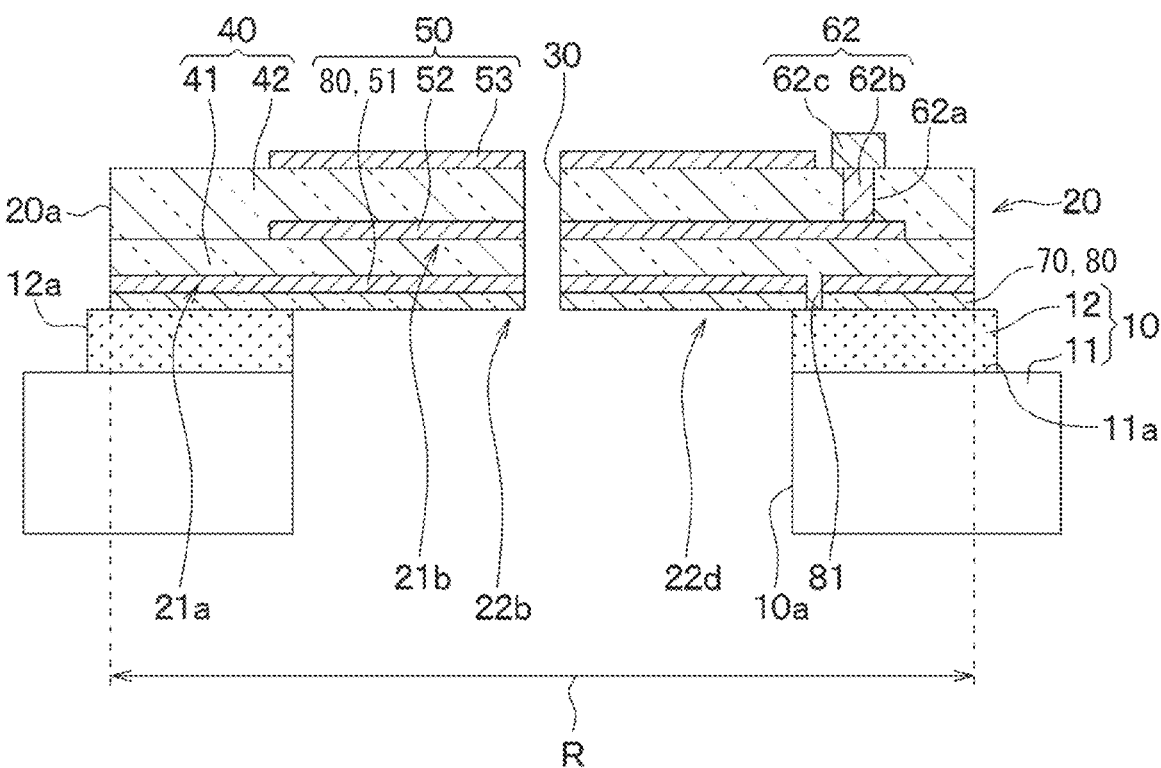
FIG. 6 is a cross-sectional view of a piezoelectric element according to a third embodiment.

The piezoelectric element according to the present embodiment is formed as illustrated in FIG. 6. Each of the buffer layer 70 and the lower electrode film 51 has a first portion where the seed layer 80 is formed and a second portion disposed at the float region 21*b*. A partition slit 81 is provided between the first and second portions for partitioning the buffer layer 70 and the lower electrode film 51. In other words, in the present embodiment, each of the buffer layer 70 and the lower electrode film 51 includes a portion on the support region 21*a* where the seed layer 80 is formed. The partition slit 81 partitions each of the buffer layer 70 and the lower electrode film 51 into a portion facing the intermediate electrode film 52 at the support region 21*a* and a portion at the float region 21*b*. The partition slit 81 may also be referred to as a slit.

According to the present embodiment, the seed layer 80 is disposed at a portion of the intermediate electrode film 52 connected to the second through electrode 62*b*, between the lower piezoelectric film 41 and the insulation film 12. Therefore, it is possible to prevent the portion of the intermediate electrode film 52 connected to the second through electrode 62*b* from losing its crystallinity, and it is possible to attain the advantageous effect identical to the one in the first embodiment.

In the present embodiment, each of the buffer layer 70 and the lower electrode film 51 has a first portion where the seed layer 80 is formed and a second portion disposed at the float region 21*b*. The partition slit 81 is provided between the first and second portions for dividing the buffer layer 70 and the lower electrode film 51 into the first and second portions. Therefore, it is possible to suppress a decline in the detection precision. Since the portion where the seed layer 80 is formed is a portion facing the intermediate electrode film 52, a parasitic capacitance is formed between the lower electrode film 51 included in the seed layer 80 and the intermediate electrode film 52. It is possible to inhibit a decline in the detection precision through the parasitic capacitance generated in the seed layer 80 by forming the partition slit 81.

Fourth Embodiment

The following describes a fourth embodiment. In the present embodiment, the configuration of the seed layer 80 is changed from that of the second embodiment. Descriptions of the same configurations and processes as those of the second embodiment will not be repeated hereinafter.

Figure 7:
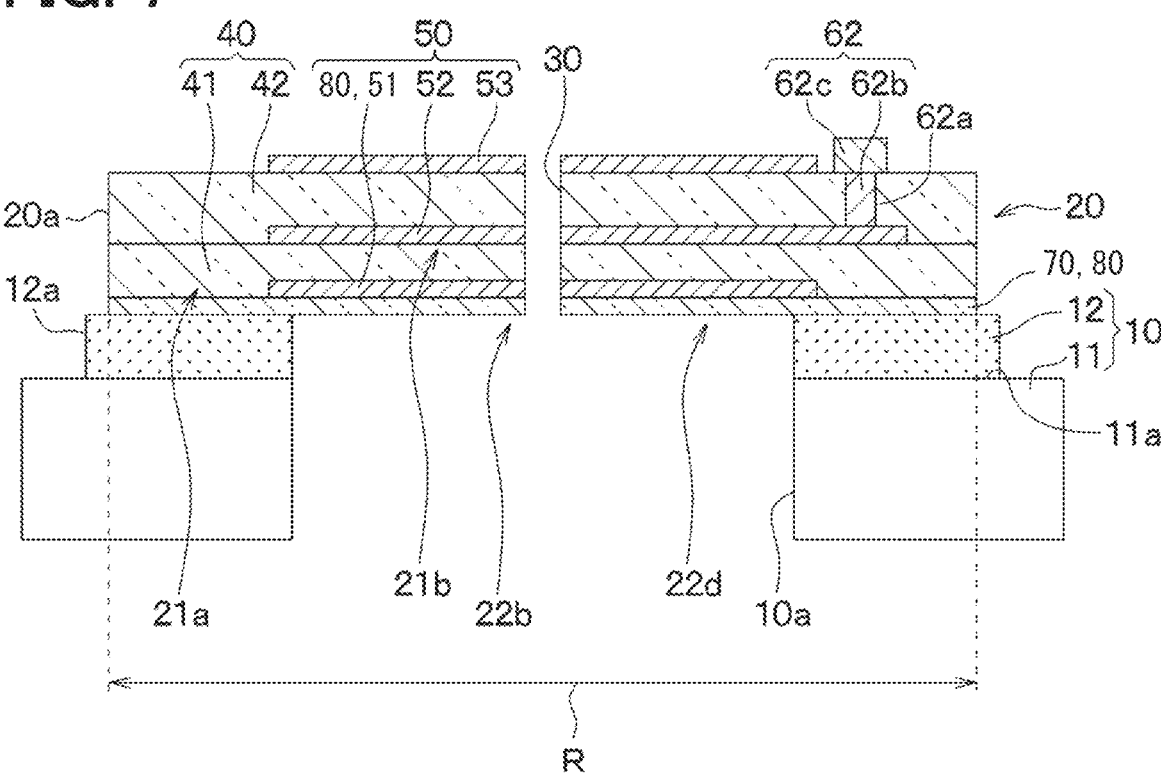
FIG. 7 is a cross-sectional view of a piezoelectric element according to a fourth embodiment.

The piezoelectric element according to the present embodiment is formed as illustrated in FIG. 7. The buffer layer 70 extends to the outer edge end portion of the element region R as similar to the second embodiment; however, the lower electrode film 51 does not extend to a portion facing the second through electrode 62*b*. In other words, the seed layer 80 according to the present embodiment includes a portion of the buffer layer 70 facing the second through electrode 62*b*. In other words, the seed layer 80 includes only the buffer layer 70. The buffer layer 70 is made of aluminum nitride, and is made of material having a lattice constant closer to the lower piezoelectric film 41 than the insulation film 12.

According to the present embodiment, the seed layer 80 is disposed at a portion of the intermediate electrode film 52 connected to the second through electrode 62*b*, between the lower piezoelectric film 41 and the insulation film 12. Therefore, it is possible to prevent the portion of the intermediate electrode film 52 connected to the second through electrode 62*b* from losing its crystallinity, and it is possible to attain the advantageous effect identical to the one in the first embodiment.

In the present embodiment, the seed layer 80 includes only the buffer layer 70. Therefore, it is possible to inhibit the formation of unnecessary parasitic capacitance at the support region 21*a*. As a result, it is possible to suppress a decline in the detection precision even though the partition slit 81 described in the third embodiment is not formed.

Fifth Embodiment

The following describes a fifth embodiment. In contrast to the first embodiment, the present embodiment does not include the buffer layer 70. The other configurations are the same as those of the first embodiment, and therefore a description of the same configurations will be omitted below.

Figure 8:
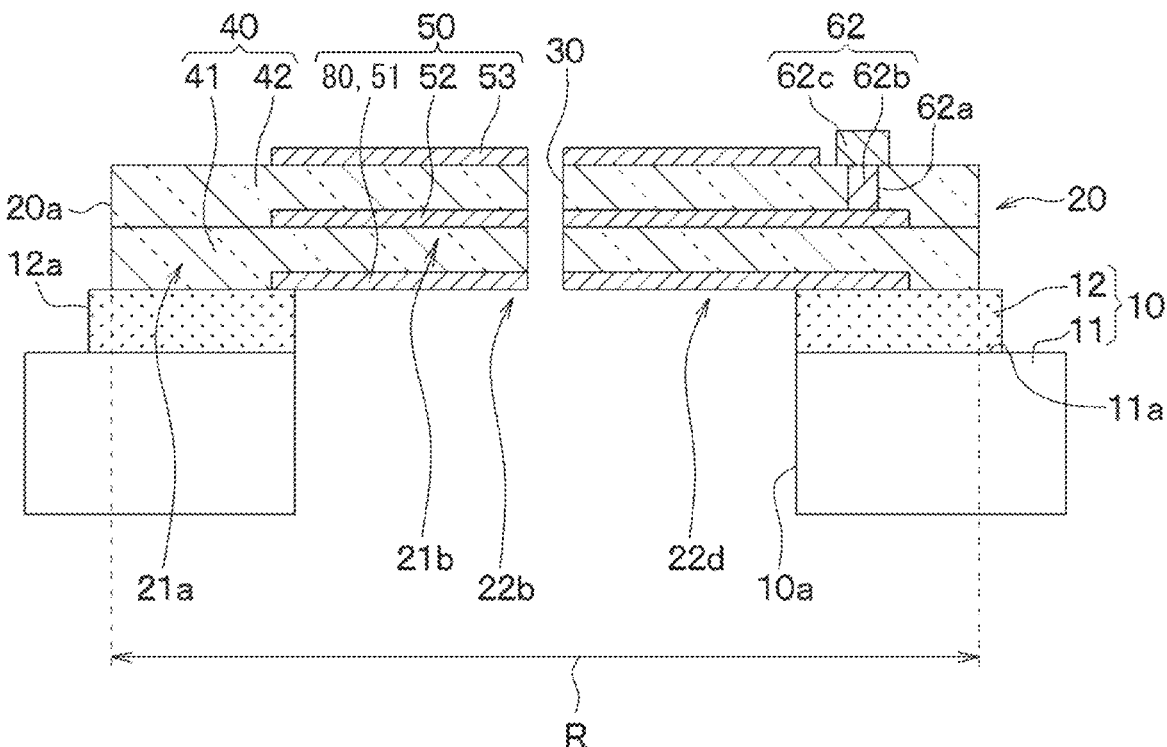
FIG. 8 is a cross-sectional view of a piezoelectric element according to a fifth embodiment.

The piezoelectric element according to the present embodiment does not have the buffer layer 70 as illustrated in FIG. 8. The lower electrode film 51 is formed to include a portion of the intermediate electrode film 52 facing the portion connected to the second through electrode 62*b*. Therefore, the seed layer 80 according to the present embodiment includes a portion of the lower electrode film 51 facing the second through electrode 62*b*. In other words, the seed layer 80 according to the present embodiment includes only the lower electrode film 51.

According to the present embodiment, between the lower piezoelectric film 41 and the insulation film 12, the seed layer 80 is disposed at a portion of the intermediate electrode film 52 connected to the second through electrode 62*b*. Therefore, it is possible to prevent the portion of the intermediate electrode film 52 connected to the second through electrode 62*b* from losing its crystallinity, and it is possible to attain the advantageous effect identical to the one in the first embodiment.

As in the present embodiment, even though the seed layer 80 is made to include only the lower electrode film 51, it is possible to prevent the portion of the intermediate electrode film 52 connected to the second through electrode 62*b* from losing its crystallinity through the formation of the seed layer 80. Therefore, the same effects as those of the first embodiment can be obtained.

Sixth Embodiment

The following describes a sixth embodiment. In the present embodiment, the configuration of the seed layer 80 is changed from that of the first embodiment. The other configurations are the same as those of the first embodiment, and therefore a description of the same configurations will be omitted below.

Figure 9:
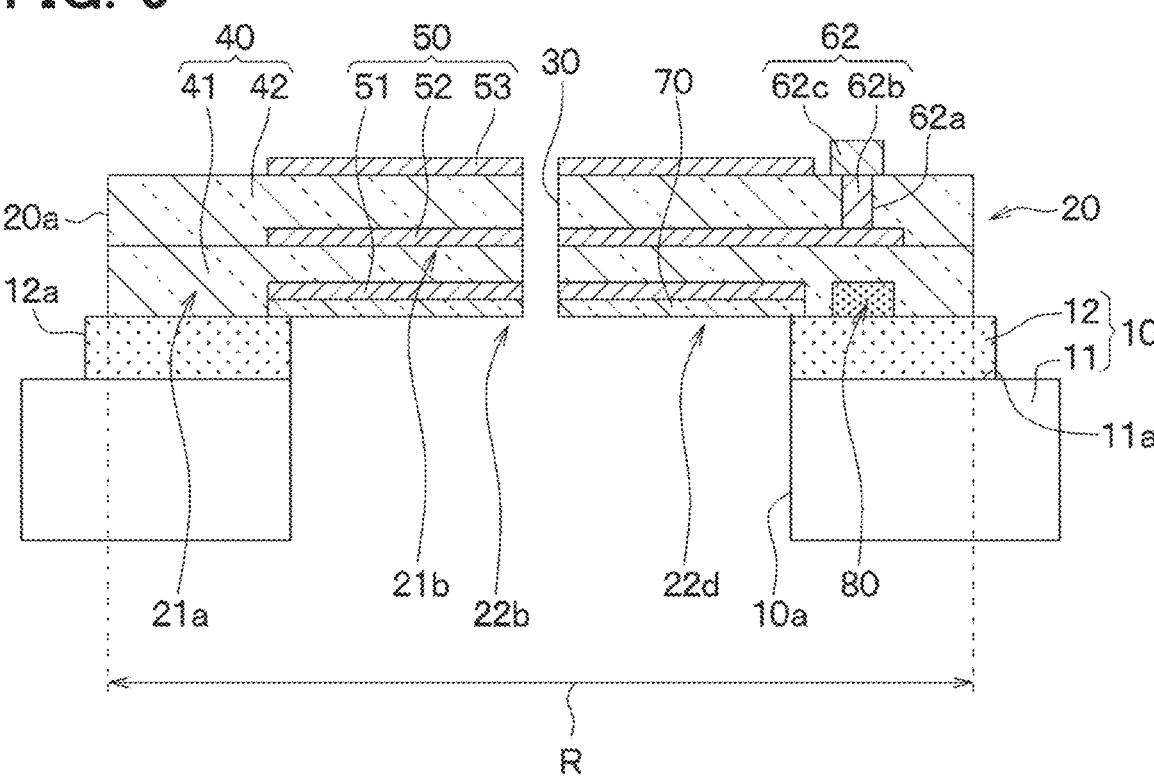
FIG. 9 is a cross-sectional view of a piezoelectric element according to a sixth embodiment.

In the piezoelectric element according to the present embodiment, as illustrated in FIG. 9, the seed layer 80 is made of material different from the buffer layer 70 and the lower electrode film 51. In the present embodiment, the seed layer 80 adopts ScAlN having lower concentration of scandium than the piezoelectric film 40.

The piezoelectric film 40 is made of ScAlN, and the concentration of scandium is 30% or higher.

According to the present embodiment, between the lower piezoelectric film 41 and the insulation film 12, the seed layer 80 is disposed at a portion of the intermediate electrode film 52 connected to the second through electrode 62b. Therefore, it is possible to prevent the portion of the intermediate electrode film 52 connected to the second through electrode 62b from losing its crystallinity, and it is possible to attain the advantageous effect identical to the one in the first embodiment.

In the present embodiment, the seed layer 80 is made of ScAlN having lower concentration of scandium than the piezoelectric film 40. Therefore, even though the lower piezoelectric film 41 is made of ScAlN having relatively high concentration of scandium, it is possible to prevent the lower piezoelectric film 41 on the seed layer 80 from losing its crystallinity.

In other words, in a case where ScAlN is adopted as the lower piezoelectric film 41, the lattice constant increases as the scandium concentration increases. According to the reviews made by the inventors in the present application, in a case where the lower piezoelectric film 41 is made of ScAlN having scandium concentration of 30% or higher, even though the lower electrode film 51 is made of, for example, molybdenum, the inventors confirmed that the lower piezoelectric film 41 may not be sufficiently prevented from losing its crystallinity. In the present embodiment, the seed layer 80 is made of ScAlN having lower scandium concentration than the piezoelectric film 40. As a result, since the lower piezoelectric film 41 is formed on the identical material, it is possible to prevent the lower piezoelectric film 41 on the seed layer 80 from losing its crystallinity. Therefore, it is possible to prevent the portion of the intermediate electrode film 52 connected to the second through electrode 62b from losing its crystallinity, and it is possible to suppress a decline in the reliability of the connection between the intermediate electrode film 52 and the second through electrode 62b. Although the above describes that the piezoelectric film 40 is made of ScAlN with relatively high concentration of scandium, the piezoelectric film 40 may also be made of ScAlN with relatively low concentration.

(Modification of Sixth Embodiment)

The following describes the modification of the sixth embodiment. In the sixth embodiment, the seed layer 80 may be made of another kind of material. The seed layer 80 may adopt oxide of metallic material having a main component being one of, for example, molybdenum, titanium, platinum, aluminum, and ruthenium. The oxide herein includes different valences and is not limited to an oxide having a specific valence. The seed layer 80 may be made of, for example, amorphous material. In a case where the seed layer 80 is made of these kinds of material, it may be preferable that the lower piezoelectric film 41 is made of, for example, ScAlN, AlN with relatively low concentration.

When the seed layer 80 is made of such material, the inventors in the present application confirmed that the lower piezoelectric film 41 disposed on the seed layer 80 is hardly influenced by the seed layer 80 as a base film, and the crystallinity is not easily lost due to self-alignment. Therefore, the seed layer 80 may be made of material that easily facilitates self-alignment of the lower piezoelectric film 41 as compared with the insulation film 12.

Seventh Embodiment

The following describes a seventh embodiment. The present embodiment is a modification of the configuration of the vibrator 20 of the first embodiment. The other configurations are the same as those of the first embodiment, and therefore a description of the same configurations will be omitted below.

Figure 10:
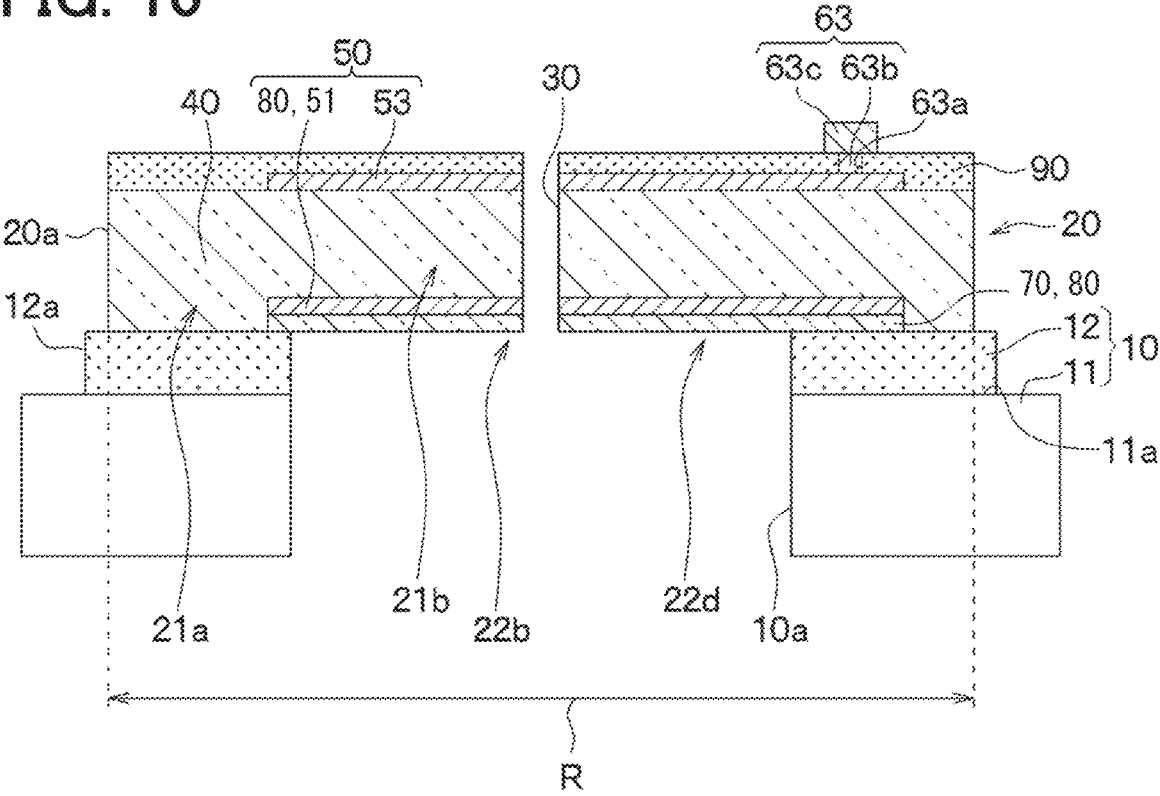
FIG. 10 is a cross-sectional view of a piezoelectric element according to a seventh embodiment.

The piezoelectric element according to the present embodiment has the piezoelectric film 40 having a single layer, and does not have the intermediate electrode film 52 as illustrated in FIG. 10. An insulation film 90 is disposed on the piezoelectric film 40 to cover the upper electrode film 53.

A hole 63a is formed at the insulation film 90 to penetrate the insulation film 90 to expose the upper electrode film 53. A through electrode 63b is disposed at the hole 63a to electrically connect the upper electrode film 53. A pad portion 63c is disposed above the insulation film 90 to electrically connect the through electrode 63b. In the present embodiment, the upper electrode film 53 corresponds to an electrode coating film.

The buffer layer 70 and the lower electrode film 51 are formed to include a portion of the upper electrode film 53 facing the portion connected to the through electrode 63b. The seed layer 80 is made of a portion of each of the buffer layer 70 and the lower electrode film 51 facing the portion of the upper electrode film 53 connected to the through electrode 63b. The seed layer 80 according to the present embodiment has a larger area than the through electrode 63b in the stacking direction.

According to the present embodiment, the seed layer 80 is disposed at a portion of the upper electrode film 53 facing the portion connected to the through electrode 63b, between the piezoelectric film 40 and the insulation film 12. Therefore, it is possible to prevent the portion of the upper electrode film 53 connected to the through electrode 63b from losing its crystallinity, and it is possible to attain the advantageous effect identical to the one in the first embodiment.

As in the present embodiment, the piezoelectric film 40 may be formed with a single layer. Even with such a piezoelectric element, it is possible to prevent the upper electrode film 53 that is disposed on the piezoelectric film 40 and connected to the through electrode 63b from losing its crystallinity.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

For example, in each of the above embodiments, the float region 21b may have a polygonal shape such as a pentagonal shape, a hexagonal shape, or an octagonal shape instead of a rectangular shape. The number of vibration regions 22a to 22d formed at the float region 21b may be properly modified. The piezoelectric element may have a polygonal shape such as a pentagonal shape or a hexagonal shape instead of a rectangular shape.

In each of the above embodiments, the opening 20a, which is disposed at the vibrator 20, and the opening 12a, which is disposed at the insulation film 12, may not be formed at the piezoelectric element.

In each of the above embodiments, the vibration regions 22a to 22d may output the respective charges as detected signals. In this case, the first electrode portion 61 is connected to the lower electrode film 51 and the upper electrode film 53 at each of the vibration regions 22a to 22d, and the second electrode portion 62 is connected to the intermediate electrode film 52 at each of the vibration regions 22a to 22d.

In each of the first to sixth embodiments, the seed layer 80 may have a smaller area than the second through electrode 62b in the stacking direction. In the seventh embodiment, the seed layer 80 may have a smaller area than the through electrode 63b in the stacking direction.

The embodiments described above can also be combined with each other. For example, the second embodiment may be combined with the sixth embodiment to form the seed layer 80 toward the outer edge end portion. In this case, the seed layer 80 may be formed on the entire region on the insulation film 12 different from the region where the buffer layer 70 is disposed. The third embodiment may be combined with the fifth embodiment to form the partition slit 81. The second to sixth embodiments may be combined with the seventh embodiment to form the piezoelectric element having the piezoelectric film 40 with a single layer.

What is claimed is:

1. A piezoelectric element comprising:
a support member including a support substrate and an insulation film disposed on the support substrate;
a vibrator disposed on the insulation film included in the support member, the vibrator including
a piezoelectric film, and
an electrode film having an electrode coating film electrically connected to the piezoelectric film and disposed on the piezoelectric film or inside the piezoelectric film,
the vibrator having
a support region supported by the support member, and
a vibration region connected to the support region and floated from the support member;
a through electrode disposed in a stacking direction of the support member and the vibrator, the through electrode electrically connected to the electrode coating film at the support region; and a seed layer facing a portion of the electrode coating film connected to the through electrode between the piezoelectric film and the insulation film, the seed layer made of
material having a lattice constant closer to the piezoelectric film than the insulation film, or
material easier to cause the piezoelectric film to be self-aligned than the insulation film.

2. The piezoelectric element according to claim 1, wherein the seed layer has a larger area than the second portion of the electrode coating film connected to the through electrode in the stacking direction.

3. The piezoelectric element according to claim 1, wherein the seed layer extends to an outer edge end portion of the vibrator.

4. The piezoelectric element according to claim 1, wherein the vibrator further includes a buffer layer disposed at a side closer to the support member than the piezoelectric film at the vibration region,
wherein the electrode film further has a base electrode film disposed between the buffer layer and the piezoelectric film at the vibration region, and
wherein the seed layer includes a portion of the buffer layer extending to the support region.

5. The piezoelectric element according to claim 4, wherein the seed layer further includes a portion of the base electrode film extending to the support region.

6. The piezoelectric element according to claim 1, wherein the vibrator further has a base electrode film as the electrode film disposed at a side closer to the support member than the piezoelectric film at the vibration region, and
wherein the seed layer includes a portion of the base electrode film extending to the support region.

7. The piezoelectric element according to claim 5, wherein the base electrode film is divided by a slit into the portion included in the seed layer and a portion included in the vibration region.

8. The piezoelectric element according to claim 5, wherein the seed layer is made of metallic material having a main component selected from a group consisting of molybdenum, titanium, platinum, aluminum, and ruthenium.

9. The piezoelectric element according to claim 1, wherein the seed layer is made of amorphous material or oxide of metallic material having a main component selected from a group consisting of molybdenum, titanium, platinum, aluminum, and ruthenium.

10. The piezoelectric element according to claim 1, wherein the piezoelectric film is made of scandium aluminum nitride, and
wherein the seed layer is made of scandium aluminum nitride having lower concentration of scandium than the piezoelectric film.

* * * * *